(12) United States Patent
Okada et al.

(10) Patent No.: US 7,659,576 B2
(45) Date of Patent: Feb. 9, 2010

(54) SEMICONDUCTOR DEVICE AND METHOD OF MANUFACTURING THE SAME

(75) Inventors: Kikuo Okada, Saitama (JP); Kojiro Kameyama, Gunma (JP)

(73) Assignees: Sanyo Electric Co., Ltd., Moriguchi-shi (JP); Sanyo Semiconductor Co., Ltd., Gunma (JP)

( * ) Notice: Subject to any disclaimer, the term of this patent is extended or adjusted under 35 U.S.C. 154(b) by 92 days.

(21) Appl. No.: 11/933,897

(22) Filed: Nov. 1, 2007

(65) Prior Publication Data

US 2008/0135870 A1    Jun. 12, 2008

(30) Foreign Application Priority Data

Nov. 2, 2006   (JP)   .............. 2006-298524

(51) Int. Cl.
*H01L 29/78* (2006.01)

(52) U.S. Cl. .............. 257/332; 257/288; 257/328; 257/330; 257/397; 257/E29.197; 257/E29.201; 257/E21.382

(58) Field of Classification Search .............. 257/288, 257/328, 330, 332, 397, E29.197, E29.201, 257/E21.382
See application file for complete search history.

(56) References Cited

U.S. PATENT DOCUMENTS

| 5,528,066 | A | 6/1996 | Hunt | |
|---|---|---|---|---|
| 6,960,837 | B2 * | 11/2005 | Iadanza | 257/774 |
| 7,132,321 | B2 * | 11/2006 | Kub et al. | 438/172 |
| 7,259,411 | B1 * | 8/2007 | Hopper et al. | 257/288 |
| 2004/0061163 | A1 | 4/2004 | Nakayama | |
| 2004/0082116 | A1 | 4/2004 | Kub et al. | |

FOREIGN PATENT DOCUMENTS

| EP | 0 305 993 | 3/1989 |
|---|---|---|
| JP | 11-274516 | 10/1999 |
| JP | 2001-160559 | 6/2001 |

OTHER PUBLICATIONS

B. Jayant Baliga. (1996). *Power Semiconductor Devices*. PWS Publishing Company, pp. 432-434; 496-498.

European Search Report mailed Jun. 11, 2008, directed to counterpart EP application No. 07021414.3; 8 pages.

* cited by examiner

*Primary Examiner*—Ngan Ngo
*Assistant Examiner*—Benjamin Tzu-Hung Liu
(74) *Attorney, Agent, or Firm*—Morrison & Foerster LLP

(57) ABSTRACT

A punch-through type IGBT generally has a thick $p^{++}$-type collector layer. Therefore, the FWD need be externally attached to the IGBT when the IGBT is used as a switching element in an inverter circuit for driving a motor load, and thus the number of processes and components increases. In the invention, trenches are formed penetrating through a collector layer and reaching a buffer layer. A collector electrode is formed in the trenches, too. With this structure, a current path is formed between an emitter electrode and the collector electrode without through the collector layer and functions as the FWD.

9 Claims, 12 Drawing Sheets

SEMICONDUCTOR DEVICE AND METHOD OF MANUFACTURING THE SAME

CROSS-REFERENCE OF THE INVENTION

This application claims priority from Japanese Patent Application No. 2006-298524, the content of which is incorporated herein by reference in its entirety.

BACKGROUND OF THE INVENTION

1. Field of the Invention

The invention relates to a semiconductor device and a method of manufacturing the same, particularly, a semiconductor device having an insulated gate bipolar transistor (IGBT) and a method of manufacturing the same.

2. Description of the Related Art

An insulated gate bipolar transistor is called IGBT, in which a fundamental cell combines the bipolar transistor and the MOS transistor, forming a semiconductor device having both low on-voltage characteristics of the former and voltage drive characteristics of the latter.

Figure 10:
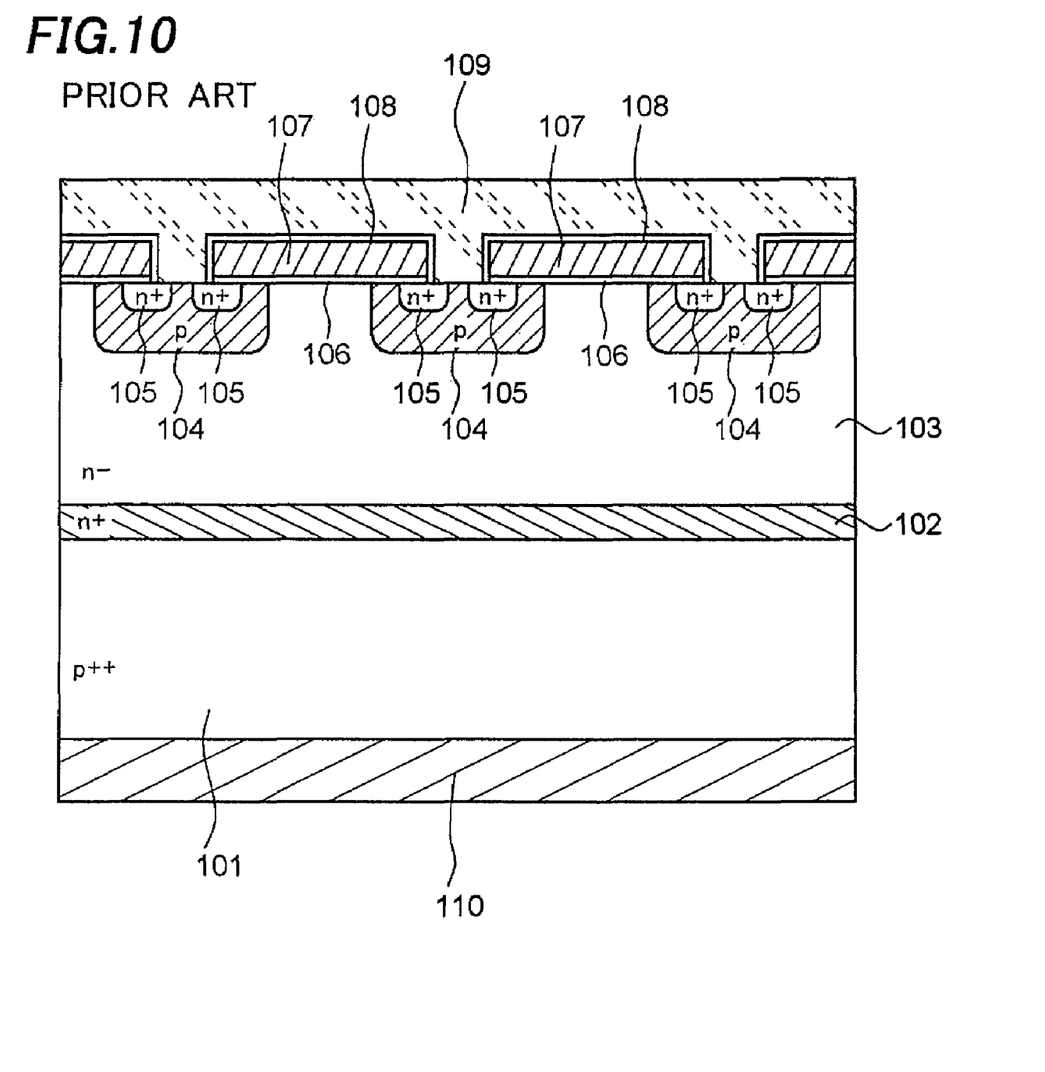
FIG. 10 shows a cross-sectional view of a conventional semiconductor device.

FIG. 10 shows a conventional semiconductor device, more specifically, a cross-sectional view of a punch-through type IGBT. This cross-sectional view shows one unit cell only, but a number of unit cells are connected in parallel actually.

First, the structure of the conventional semiconductor device will be described. An $n^+$-type buffer layer 102 and an $n^-$-type drift layer 103 are formed on the front surface side of a $p^{++}$-type semiconductor substrate (a collector layer 101) by epitaxial growth. P-type base regions 104 are selectively formed in the front surface of the drift layer 103, and $n^+$-type emitter regions 105 are selectively formed in the front surface of the base regions 104. Gate electrodes 107 are further formed covering the front surfaces of the base regions 104 at least in regions between the emitter regions 105 and the drift layer 103, with gate oxide films 106 interposed therebetween. Furthermore, the gate electrodes 107 are surrounded by an insulation film 108, and an emitter electrode 109 is formed covering the insulation film 108 and being connected with the emitter regions 105. On the other hand, a collector electrode 110 is formed on the back surface side of the collector layer 101. The gate electrodes 107, the emitter electrode 109 and the collector electrode 110 are electrically connected among all the unit cells, respectively.

Next, the operation of the conventional semiconductor device will be described. When a gate voltage over a threshold is applied between the emitter electrode 109 and the gate electrodes 107 in the state where a collector voltage is applied between the emitter electrode 109 and the collector electrode 110, channel regions in the base regions 104 adjacent to the gate electrodes 107 are inverted into the n-type. Then, electrons are injected from the emitter electrode 109 to the drift layer 103 through the channel regions.

With these electrons, the collector layer 101 and the drift layer 103 are forward biased, and holes are injected from the collector layer 101 to the drift layer 103. As a result of this, the resistance of the drift layer 103 is largely reduced, and a collector current flowing from the collector electrode 110 to the emitter electrode 109 reaches a high value.

The buffer layer 102 also has a function of preventing punch-through. In detail, without the buffer layer 102, a depletion layer expanding from the base regions 104 reaches the collector layer 101 when a collector voltage exceeds a breakdown voltage, and thus a collector current inadvertently flows even when a gate voltage is not applied. In this respect, when the buffer layer 102 is provided, the expansion of the depletion layer slows down in the buffer layer 102 and is prevented from reaching the collector layer 101. This realizes a higher breakdown voltage even with the thinner collector layer 101, and the turn-off loss is also minimized.

Furthermore, the buffer layer 102 has a function of minimizing the amount of the holes injected from the collector layer 101. That is, the buffer layer 102 has a high concentration of n-type impurity, and the holes injected from the collector layer 101 are easily recombined with the electrons in the buffer layer 102. Therefore, the on-resistance and the collector current are adjusted with the thickness and the impurity concentration of the buffer layer 102. The relevant technology is described in the Japanese Patent Application Publication No. 2001-160559, for example.

Figure 11:
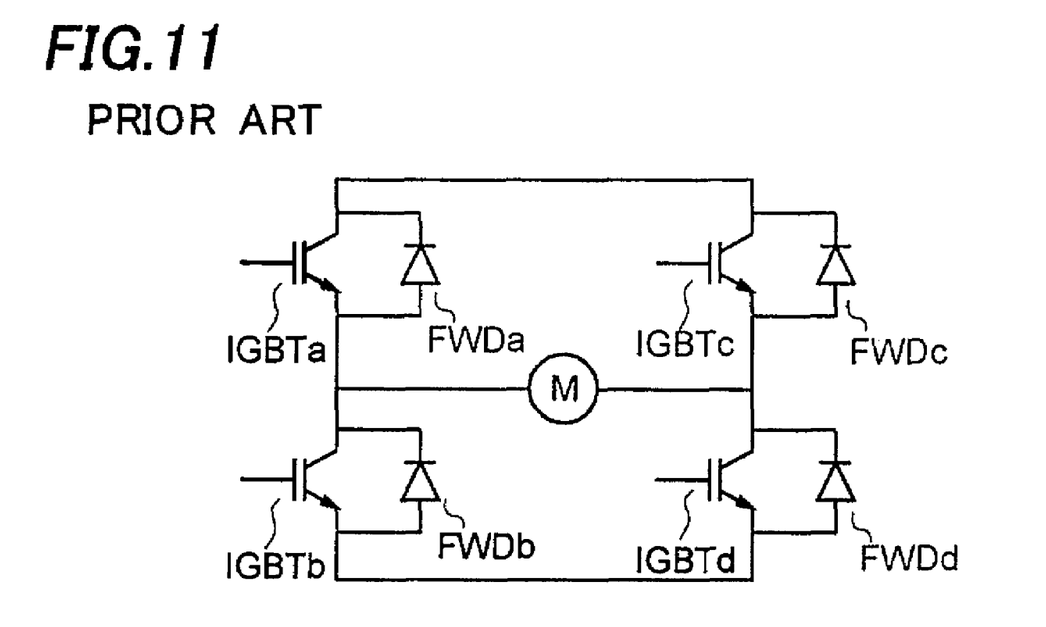
FIG. 11 shows an inverter circuit for driving a motor load.

The IGBT is used as a switching element in an inverter circuit for driving a load such as a motor. FIG. 11 shows a circuit diagram of an inverter circuit for driving a motor.

For example, when the IGBTa and the IGBTd turn on and a direct current voltage is applied to a motor load M, a current flows while accumulating and increasing an energy in the motor load M. After that, when the IGBTa and the IGBTd turn off, a current is discharged from the motor load M. At this time, if the energy accumulated in the motor load M is discharged for an instant, this current is extremely large and thus the IGBTs are broken.

For solving this, in the inverter circuit, a free wheeling diode (hereafter, referred to as FWD) is reversely and in parallel connected to each of the IGBTs. Therefore, when the IGBTa and the IGBTd turn off, a current flows back from the motor load M, taking a detour through the FWDb and the FWDc reversely and in parallel connected to the IGBTb and the IGBTc. In detail, even when the IGBTa and the IGBTd turn off, a current flowing in the motor load M is not blocked suddenly, so that the energy accumulated in the motor load M is slowly discharged and the IGBTs are not broken.

Accordingly, it is necessary in the inverter circuit to connect the FWD to each of the IGBTs reversely and in parallel. However, in the IGBT, the $p^{++}$-type collector layer 101 is formed on the whole back surface. This means the FWD is not integrated in the IGBT structurally, but a forward diode including the $p^{++}$-type collector layer 101 and the $n^+$-type buffer layer 102 is rather integrated therein.

Therefore, in the inverter circuit, the IGBT and the FWD need be configured of separate elements, and these elements are reversely and in parallel connected on a substrate in a package. This causes a large number of processes and components and a difficulty in reducing the cost.

SUMMARY OF THE INVENTION

The invention provides a semiconductor device including: a collector layer of a first conductivity type; a drift layer of a second conductivity type formed on a front surface of the collector layer; a first conductive type base region selectively formed in a front surface of the drift layer; a emitter region of the second conductive type selectively formed in a surface of the base region; a gate insulation film formed on the base region and covering a region of the base region between the drift layer and the emitter region; a gate electrode formed on the gate insulation film; and an emitter electrode connected with the emitter region; wherein an opening is formed so as to penetrate through the collector layer from a back surface of the collector layer, and a collector electrode is formed so as to cover the collector layer and the opening.

The invention also provides a semiconductor device including: a collector layer of a first conductivity type; a drift layer of a second conductivity type formed on a front surface of the collector layer; a first conductive type base region selectively formed in a surface of the drift layer; a gate insulation film formed on an inner sidewall of a trench; the trench being formed from a front surface of the base layer and reaching the drift layer; a gate electrode formed in the trench with the gate insulation film interposed therebetween; an emitter region formed in the surface of the drift layer and adjacent to the gate electrode; and an emitter electrode connected with the emitter region; wherein an opening is formed so as to penetrate through the collector layer from a back surface of the collector layer, and a collector electrode is formed so as to cover the collector layer and the opening.

The invention also provides a method of manufacturing a semiconductor device, including: providing a semiconductor substrate having a collector layer of a first conductivity type, a drift layer of a second conductivity type formed on a front surface of the collector layer, a first conductive type base region selectively formed in a front surface of the drift layer, a emitter region of the second conductive type selectively formed in a surface of the base region, a gate insulation film formed on the base region and covering a region of the base region between the drift layer and the emitter region, a gate electrode formed on the gate insulation film, and an emitter electrode connected with the emitter region; forming an opening by etching the semiconductor substrate from the collector layer to the buffer layer; and forming a collector electrode at least covering the opening.

The invention also provides a method of manufacturing a semiconductor device, including: providing a semiconductor substrate having a collector layer of a first conductivity type, a drift layer of a second conductivity type formed on a front surface of the collector layer, a first conductive type base region selectively formed in a surface of the drift layer, a gate insulation film formed on an inner sidewall of a trench; the trench being formed from a front surface of the base layer and reaching the drift layer, a gate electrode formed in the trench with the gate insulation film interposed therebetween, an emitter region formed in the surface of the drift layer and adjacent to the gate electrode, and an emitter electrode connected with the emitter region; forming an opening by etching the semiconductor substrate from the collector layer to the buffer layer; and forming a collector electrode at least covering the opening.

DETAILED DESCRIPTION OF THE INVENTION

A semiconductor device of an embodiment of this invention and a method of manufacturing that device will be described in detail referring to figures.

Figure 1A:
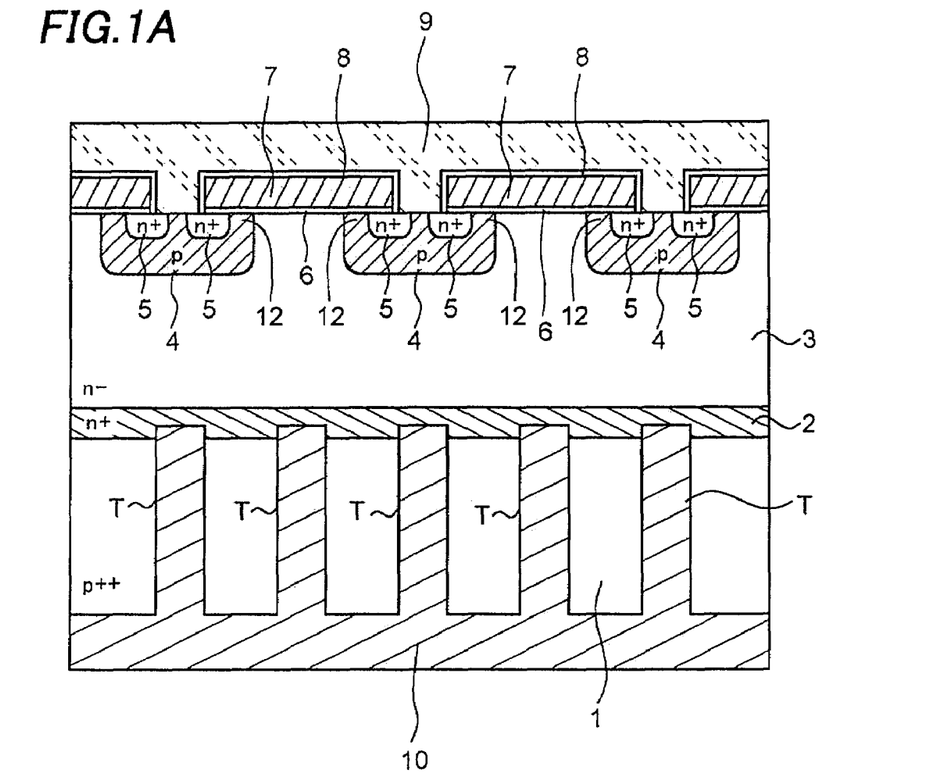
FIG. 1A shows a cross-sectional view of a semiconductor device of an embodiment the invention.
Figure 1B:
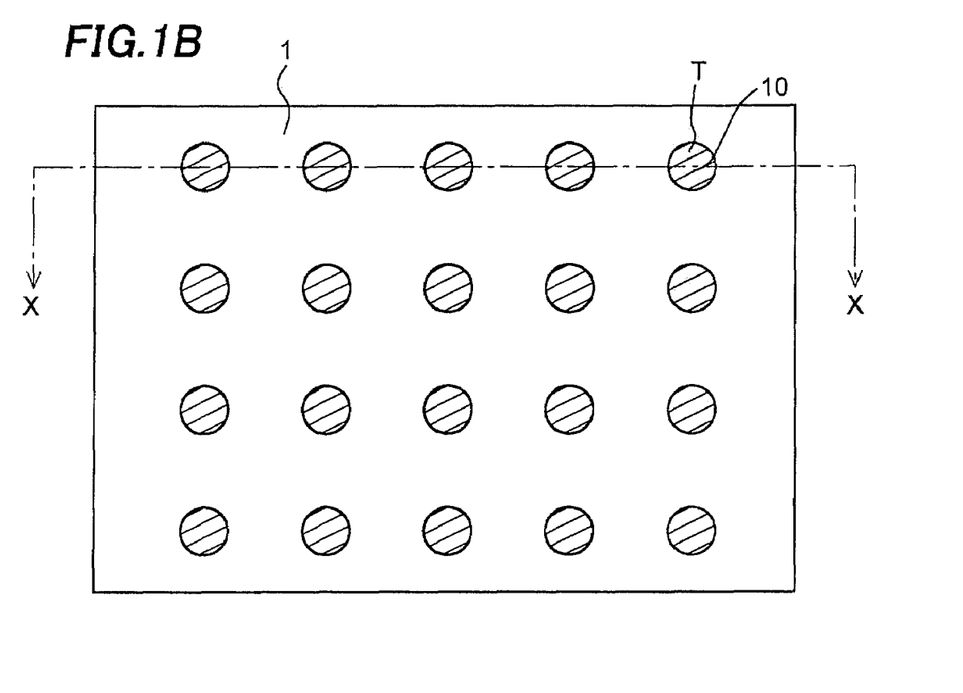
FIG. 1B shows a plane view of a semiconductor device of the embodiment.

First, a structure of the semiconductor device of the embodiment will be described. FIG. 1B shows a plane view of the semiconductor device of the embodiment. FIG. 1A shows a cross-sectional view of the semiconductor device, more specifically, a cross-sectional view of a punch-through type IGBT at line X-X in FIG. 1B This cross-sectional view shows one unit cell only, but a number of unit cells are connected in parallel actually.

An $n^+$-type buffer layer 2 and an $n^-$-type drift layer 3 are formed on the front surface side of a $p^{++}$-type semiconductor substrate (a collector layer 1) by epitaxial growth. The collector layer 1 and the drift layer 3 are about 150 µm and 50 µm in thickness, respectively.

It is noted that conductivity types such as $p^+$, p and $p^-$ belong in a general conductivity type, and conductivity types such as $n^+$, n and $n^-$ belong in another general conductivity type.

Since the buffer layer 2 contains a high concentration of n-type impurity, it has a function of preventing a depletion layer from reaching the collector layer 1 from the drift layer 3. Therefore, a higher break-down voltage is achieved even with the thin drift layer 3, so that, for example, the drift layer 3 of 50 µm is satisfying even for achieving a breakdown voltage of 400V. However, since the buffer layer 2 has the higher concentration of n-type impurity than the drift layer 3, holes injected from the collector layer 1 are easily recombined with electrons in the buffer layer 2. Therefore, the collector layer 1 need have a large amount of impurities in total, so that the collector layer 1 need be formed thick and have the thickness of 150 µm.

It is noted that the total amount of the impurities of the collector layer 1 also increases by increasing the impurity concentration of the collector layer 1. However, since the crystallinity of the collector layer 1 is disturbed when its impurity concentration is too high, there is a limitation on increasing the total amount of the impurities only by increasing the impurity concentration. Therefore, the collector layer 1 can not be formed thinner.

P-type base regions 4 are selectively formed in the front surface of the drift layer 3, and $n^+$-type emitter regions 5 are selectively formed in the front surfaces of these base regions 4. Gate electrodes 7 are formed covering at least portions of the base regions 4 between the emitter regions 5 and the drift layer 3, with the gate oxide films 6 interposed therebetween. Polysilicon, polycide or the like is used as an electrode material for forming the gate electrodes 7. The gate electrodes 7 are surrounded by an insulation film 8, and an emitter electrode 9 is formed covering the insulation film 8 and being connected with the emitter regions 5. The insulation film 8 may form any other shape as long as it covers the gate electrodes 7 and has openings on the emitter regions. Al, Cu or the like is used as an electrode material for forming the emitter electrode 9, for example.

On the other hand, on the back surface side of the collector layer 1, a plurality of trenches T are formed penetrating through the collector layer 1 and terminating in the buffer layer 2. Each of the trenches T has a circle shape and is distributed uniformly in the collector layer 1 as shown in FIG. 1B.

A collector electrode 10 is further formed filling the trenches T and covering the back surface of the collector layer 1. Cu, Al, polysilicon or the like is used as an electrode material for forming the collector electrode 10, for example. When polysilicon is used, in particular, this provides little difference in coefficient of thermal expansion between the collector layer 1 and the collector electrode 10, thereby enhancing the stability.

As described above, the collector layer 1 is formed thick and has the thickness of 150 µm. In this respect, the depths of the trenches T are still easy to control with those diameters being kept almost constant in the planar direction, independent of the depth. Therefore, the depths of the trenches T are controlled so that the trenches T terminate in the buffer layer 2.

When each of the trenches T has a large diameter and thus provides a high trench density, the area of the collector layer 1 is reduced and the total amount of the impurities of the collector layer 1 is reduced. On the other hand, when each of the trenches T has a small diameter and thus provides a low trench density, the FWD does not work enough. However, since the diameters and the shapes of the trenches T are easy to control, such a trade-off is easy to adjust.

Next, an operation of the semiconductor device of the embodiment will be described. As shown in FIG. 1, the semiconductor device of the embodiment includes three types of operation aspects, i.e., the IGBT, the MOS transistor and the FWD.

In detail, when the gate electrodes 7 turn on, there occur two types of current paths through the collector layer 1 and through the collector electrode 10 in the trenches T, respectively. The former contributes to the operation as the IGBT, and the latter contributes to the operation as the MOS transistor. When the gate electrodes 7 turn off, on the contrary, there occurs only one current path through the collector electrode 10 in the trenches T, which contributes to the operation as the FWD.

In detail, when the gate electrodes 7 turn on, i.e., when a gate voltage over a threshold is applied between the emitter electrode 9 and the gate electrodes 7 in the state where a collector voltage is applied between the emitter electrode 9 and the collector electrode 10, channel regions 12 in the base regions 4 near the gate electrodes 7 are inverted to the n-type. Then, electrons are injected from the emitter electrode 9 to the drift layer 3 through the channel regions 12. With these electrons, the collector layer 1 and the drift layer 3 are forward biased, and holes are injected from the collector layer 1 to the drift layer 3. As a result of this, the resistance of the drift layer 3 largely reduces and a collector current flows from the collector electrode 10 to the emitter electrode 9.

At this time, in the semiconductor device of the embodiment, there are two types of current paths of the collector current; one that passes through the collector layer 1 and another that does not pass through the collector layer 1. That is, the path of the former includes the collector electrode 10, the collector layer 1, the buffer layer 2, the drift layer 3, the base regions 4, and the emitter electrode 9. The path of the latter includes the collector electrode 10, the buffer layer 2, the drift layer 3, the base regions 4, and the emitter electrode 9 since the current flows from the collector electrode 10 to the buffer layer 2 directly without through the collector layer 1 by flowing through the collector electrode 10 in the trenches T. The path of the former corresponds to the function as the IGBT, and the path of the latter corresponds to the operation as the MOS transistor.

On the contrary, when the gate electrodes 7 are switched from on to off, i.e., when a gate voltage of only 0V or below a threshold is applied between the emitter electrode 9 and the gate electrodes 7 in the state where a collector voltage is applied between the emitter electrode 9 and the collector electrode 10, the channel regions 12 turn back to the p-type and electrons are not injected from the emitter electrode 9 to the drift layer 3. Therefore, holes are not injected from the collector layer 1 to the drift layer 3 and the resistance of the drift layer 3 becomes high, so that the collector current does not flow. In such a state, when a voltage is applied between the emitter electrode 9 and the collector electrode 10 by, for example, a motor load connected to outside, a forward current flows through the emitter electrode 9, the base regions 4, the drift layer 3, the buffer layer 2, and the collector electrode 10 in the trenches T. That is, in the semiconductor device of this embodiment, since the trenches T penetrate through the collector layer 1 to reach the buffer layer 2 and the collector electrode 10 is formed in these trenches T, too, the current path from the emitter electrode 9 to the collector electrode 10 includes a current path which does not pass through the collector layer 1. In this current path, the base regions 4, the drift layer 3 and the buffer layer 2 function as the FWD.

In the semiconductor device of this embodiment, even when a large collector voltage is applied when the gate electrode 7 is turned off, the expansion of a depletion layer from the base region 4 is controlled by the buffer layer 2 and prevented from reaching the collector layer 1. Therefore, even with the thin drift layer 3, a depletion layer expanding from the base region 4 does not easily reach the collector layer 1, thereby achieving a higher breakdown voltage.

Next, a description will be given on a method of manufacturing the semiconductor device of the embodiment.

Figure 2:
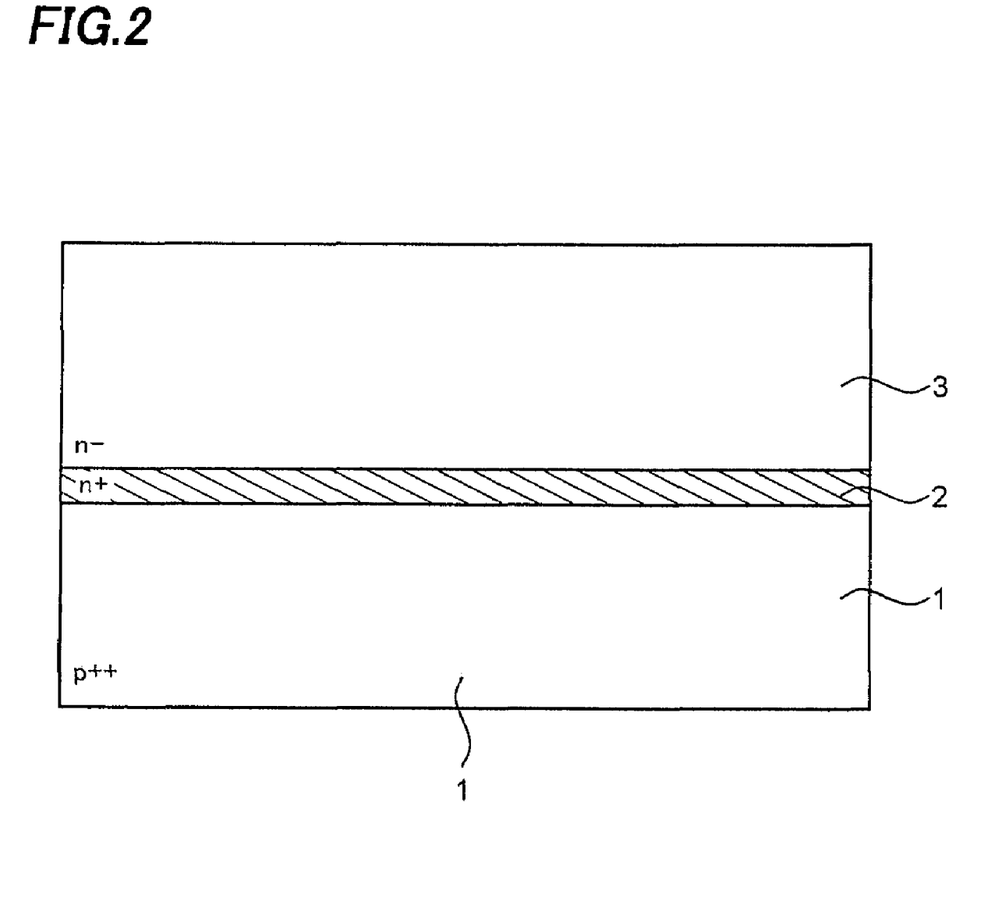
FIGS. 2 to 6 show cross-sectional views of processes of manufacturing the semiconductor device of the embodiment.

First, as shown in FIG. 2, the $n^+$-type buffer layer 2 doped with phosphorus at $1\times10^{17}/cm^2$ is formed on the $p^{++}$-type semiconductor substrate (the collector layer 1) doped with, for example, boron at $1\times10^{18}/cm^2$ by epitaxial growth, to have a thickness of 10 μm. The $n^-$-type drift layer 3 which has a lower concentration of impurity than the buffer layer 2 is formed on the buffer layer 2 by epitaxial growth. In the semiconductor device of the embodiment, the thinner drift layer 3 is realized by the buffer layer 2 formed between the collector layer 1 and the drift layer 3, and thus the drift layer 3 is formed to have a thickness of 50 μm even for achieving a breakdown voltage of 400V, for example.

Figure 3:
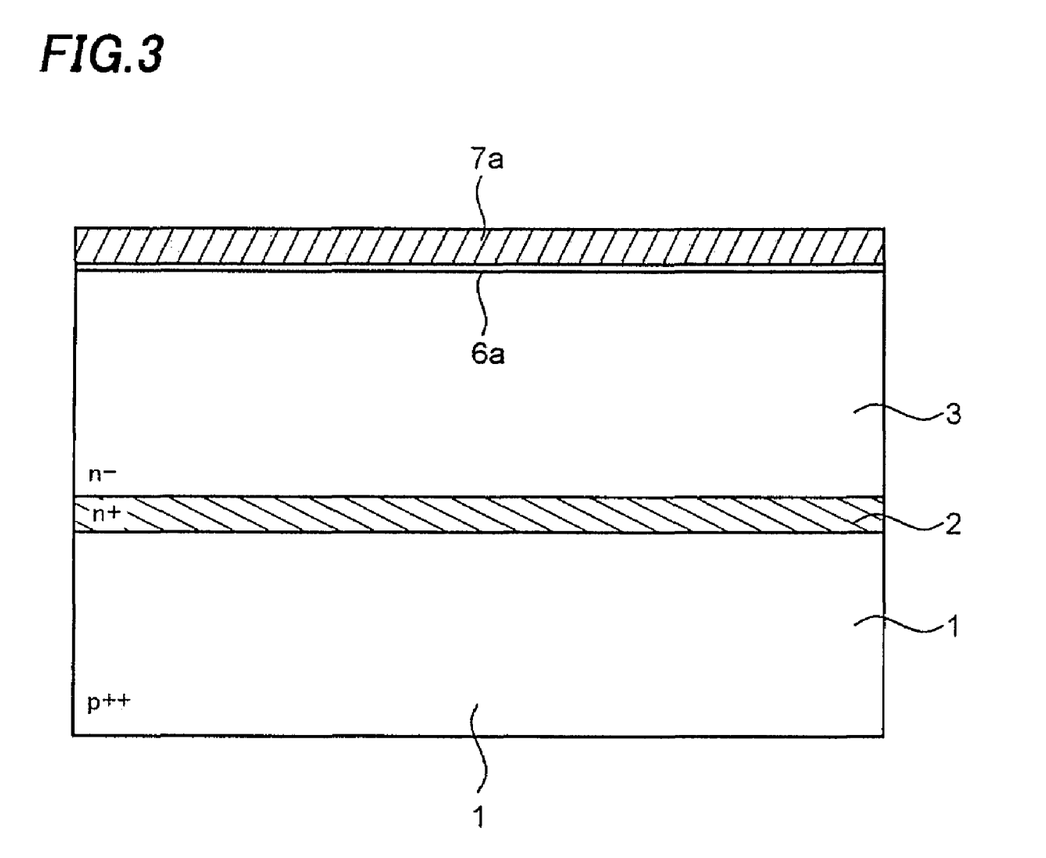

Then, as shown in FIG. 3, the front surface of the drift layer 3 is thermally oxidized to form a thermal oxidation film 6a. A gate electrode material 7a is then deposited on the thermal oxidation film 6a. Polysilicon or polycide is used as the gate electrode material 7a, for example.

Figure 4:
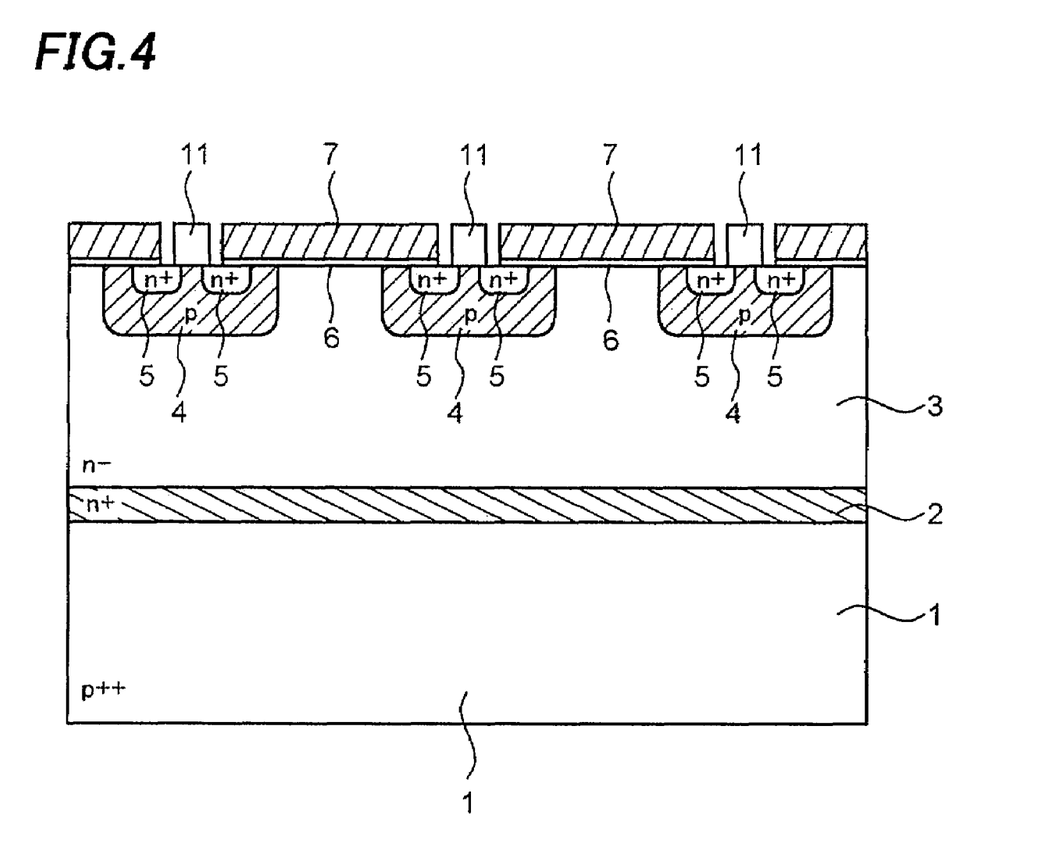

Then, as shown in FIG. 4, a photolithography and an etching are performed to the thermal oxidation film 6a and the gate electrode material 7a to form the gate oxide films 6 and the gate electrodes 7. A p-type impurity such as boron or the like is then ion-implanted in the drift layer 3 using the gate electrodes 7 as a mask to form the p-type base regions 4. A photoresist film 11 having openings in predetermined positions on the base regions 4 is then formed, and then a high concentration of n-type impurity such as phosphorus or the like is ion-implanted in the base regions 4 and a heat treatment is performed thereto to form the $n^+$-type emitter regions 5. When the adjacent emitter regions 5 are connected to each other by the heat treatment, a high concentration of p-type impurity is preferably ion-implanted in a portion to separate the emitter regions 5.

Figure 5:
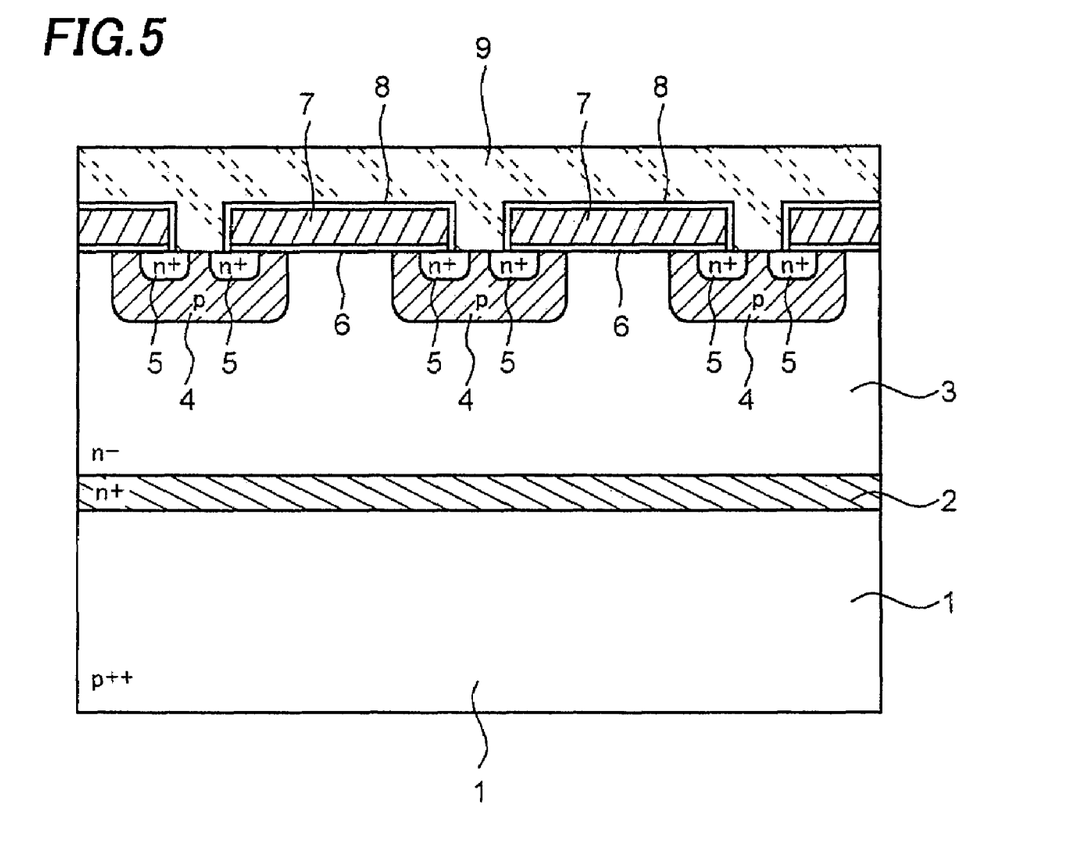

Then, as shown in FIG. 5, the insulation film 8 is formed to cover the whole front surface, and then a photolithography and an etching are performed thereto to form the insulation film 8 having openings on the emitter regions 5. An emitter electrode material such as Al, Cu or the like is then embedded therein so as to be connected to the emitter region 5, forming the emitter electrode 9.

Figure 6:
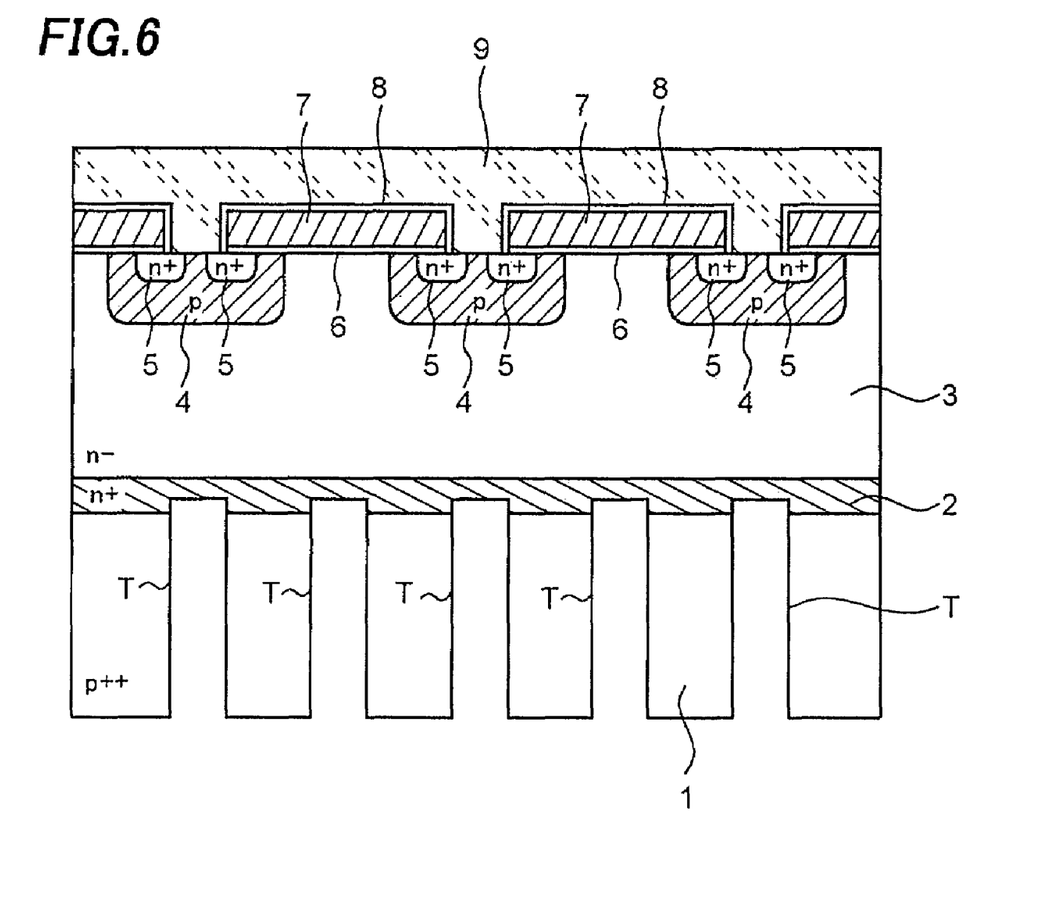

Then, as shown in FIG. 6, a photoresist pattern is formed on the back surface of the collector layer 1, and then a dry-etching with, for example, a CF type gas or an HBr type gas is performed thereto using this photoresist pattern as a mask to form the trenches T. The trenches T are formed to penetrate at least through the collector layer 1 and terminate in the buffer layer 2.

The above-described etching method is selected as appropriate depending on the depths, shapes or the like of the trenches T. For example, the Bosch process is preferably selected when the thickness of the collector layer 1 is about 150 µm. The Bosch process vertically etches the substrate deep by alternately repeating a plasma etching process mainly using $SF_6$ gas and a plasma deposition process mainly using $C_4F_8$ gas. However, the Bosch process may cause the inner wall surfaces of the trenches T to have a rough wavy form, and this form may cause problems in the subsequent processes. For example, the rough wavy surface may also be an obstacle when the trenches T having the small diameters are filled with the electrode material, providing a difficulty in completely filling the trenches T with the electrode material. For solving these problems, it is preferable to further perform a dry-etching after the Bosch process to planarize the inner walls of the trenches T, for example. Each of the trenches T formed by this Bosch process has an almost constant opening diameter in its depth direction. Therefore, even in the case of the thick collector layer 1, when the trenches T are formed to reach the buffer layer 2 and terminate therein, the connection of the adjacent trenches T is avoidable by control.

Then, as shown in FIG. 1, the collector electrode 10 is formed to cover the back surface of the collector layer 1 and fill the trenches T. Cu, Al or the like is used as a material of this collector electrode, for example. Polysilicon may be used as the material of the collector electrode, and in this case its coefficient of thermal expansion is almost equal to that of the collector layer 1 and thus the stability is enhanced. It may be difficult to fill the trenches T with the collector electrode 10 depending on the diameters or depths of the trenches T. In this case, another etching may be performed so as to expand the openings of the trenches T only, for example.

The semiconductor device and the method of manufacturing the semiconductor device of the embodiment are thus described above in detail referring to figures.

In the semiconductor device of the embodiment, the collector electrode 10 is formed in the collector layer 1 from its back surface to reach the buffer layer 2. This provides both a portion formed with the collector layer 1 between the buffer layer 2 and the collector electrode and a portion not formed with the collector layer 1 therebetween. This realizes the integration of the FWD in the IGBT, independent of the thickness of the collector layer 1, so that the number of processes and components is reduced in an inverter such as a motor driver.

In the method of manufacturing the semiconductor device of the embodiment, the shortcut between the collector electrode 10 and the buffer layer 2 is formed by forming the trenches T in the collector layer 1. Therefore, the above structure is formed according to the etching condition of the trenches T, independent of the thickness of the collector layer 1. In particular, the punch-through type IGBT has the thick collector layer 1, so that the embodiment is excellently applied thereto.

The embodiments disclosed herein are exemplary in all aspects and do not limit the scope of this invention.

Figure 7:
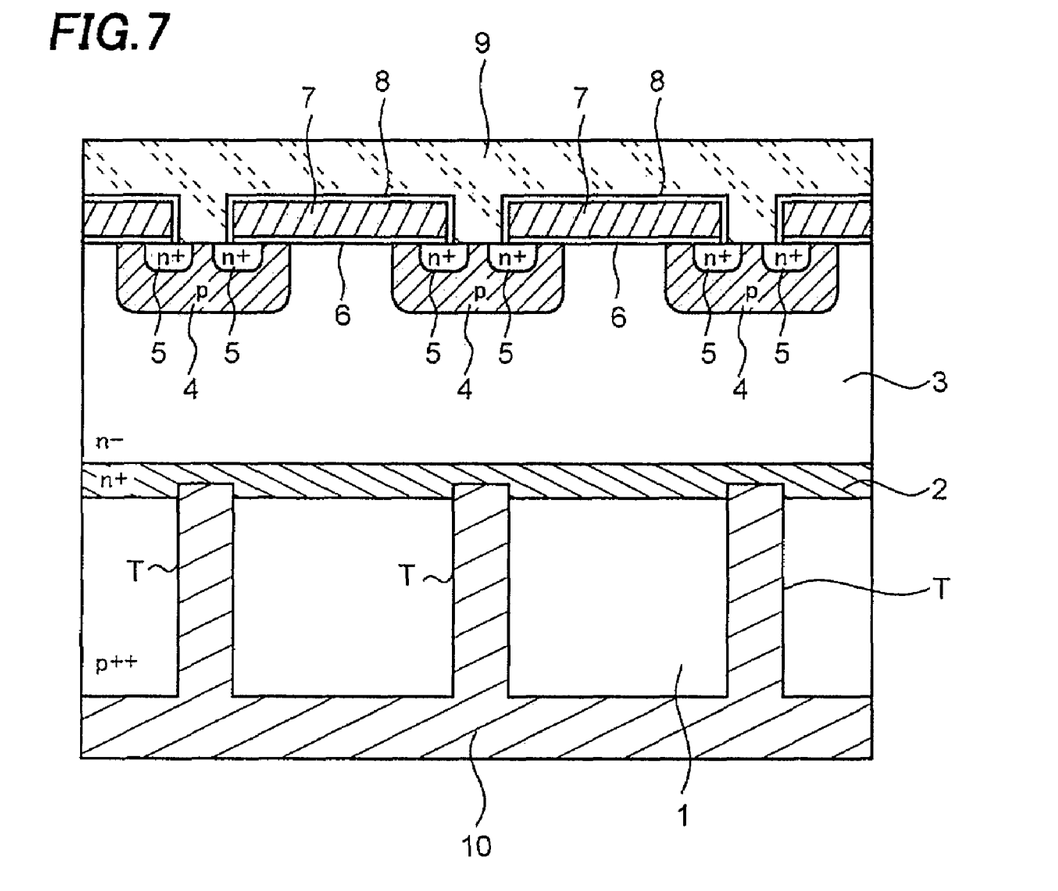
FIGS. 7 to 9 show cross-sectional views of the semiconductor device of the embodiment.

For example, in the above description of the semiconductor device and the method of manufacturing the semiconductor device of the embodiment, the positional relationship between the trenches T and the elements formed on the front surface of the drift layer 3 is not particularly limited. However, taking this positional relationship into account provides an optimal property for use. For example, when functioning as the FWD, the current path includes the emitter electrode 9, the base regions 4, the drift layer 3, the buffer layer 2 and the collector electrode 10 in the trenches T. This means that the current path is not formed under the gate electrodes 7. Therefore, as shown in FIG. 7, by forming each of the trenches T under a region between the gate electrodes 7 where the emitter electrode 9 and the drift layer 3 are directly connected, the current path as the FWD becomes shortest, the region as the IGBT becomes larger, and the area efficiency of the semiconductor device is enhanced.

Figure 8:
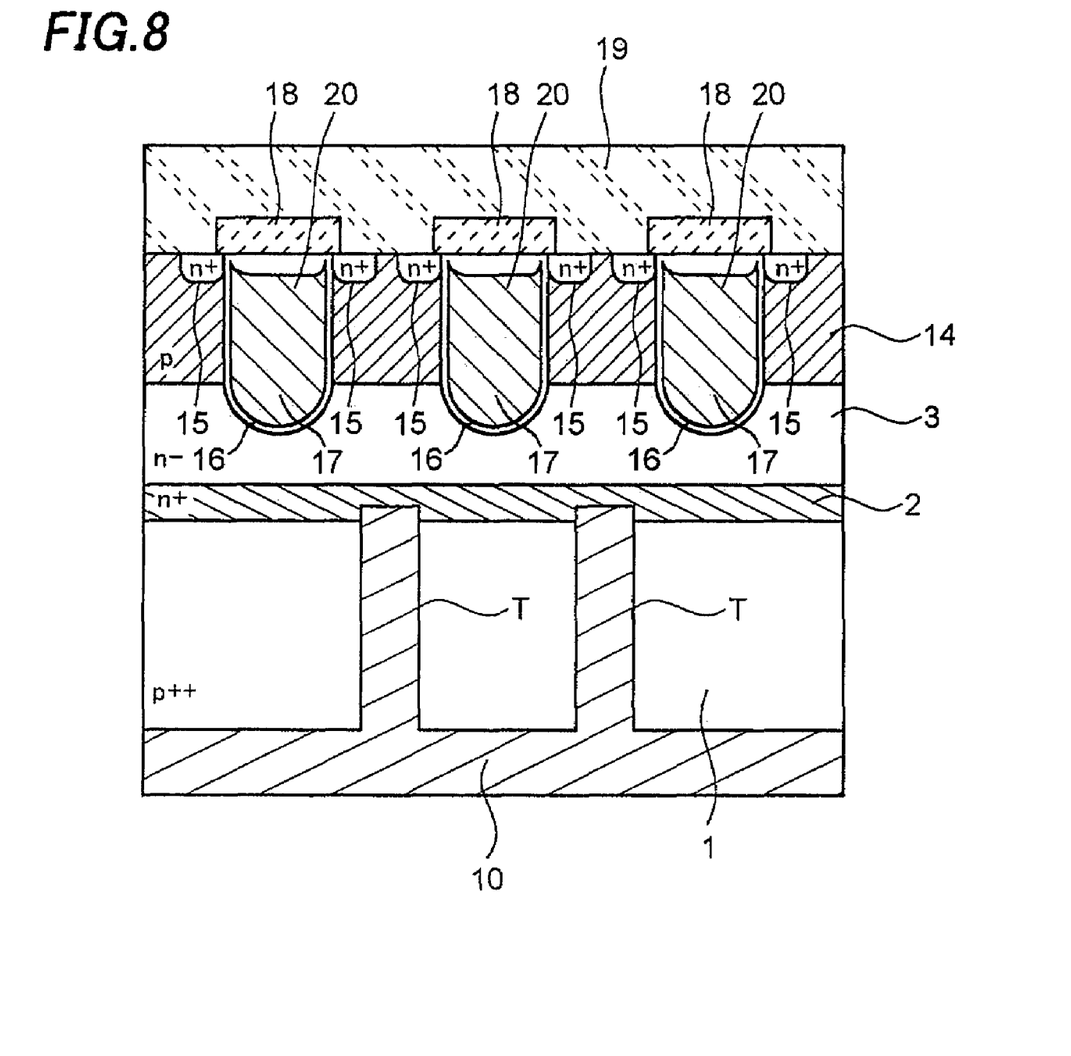

Furthermore, in the above description of the semiconductor device and the method of manufacturing the semiconductor device of the embodiment, the gate electrodes 7 are formed on the emitter regions 5, the base regions 4 and the drift layer 3. However, the MOS structure on the front side of the embodiment is not limited to this. For example, as shown in FIG. 8, the gate electrode 17 may be formed to have the trench-type structure. That is, trenches 20 are formed penetrating through the base regions 14 from the emitter regions 15 and reaching the drift layer 3, gate oxide films 16 are formed on the inner sidewalls of these trenches 20, and the gate electrodes 17 are embedded in the trenches 20. With this structure, portions of the base regions 14 near the gate electrodes 17 serve as the channel regions 12. The insulation film 18 is formed on the gate electrodes 17, and the emitter electrode 19 covers the front surface, being connected with the emitter regions 15. In this structure, too, the trenches T may be formed independent of the structure on the front surface, but the area efficiency is enhanced by forming the trenches T in relation to the structure on the front surface. For example, when each of the trenches T is formed under a portion between the gate electrodes 17 where the emitter electrode 19 and the base region 14 are directly connected, the current path as the FWD becomes shortest, the region as the IGBT becomes larger, and the area efficiency of the semiconductor device is enhanced.

Figure 9:
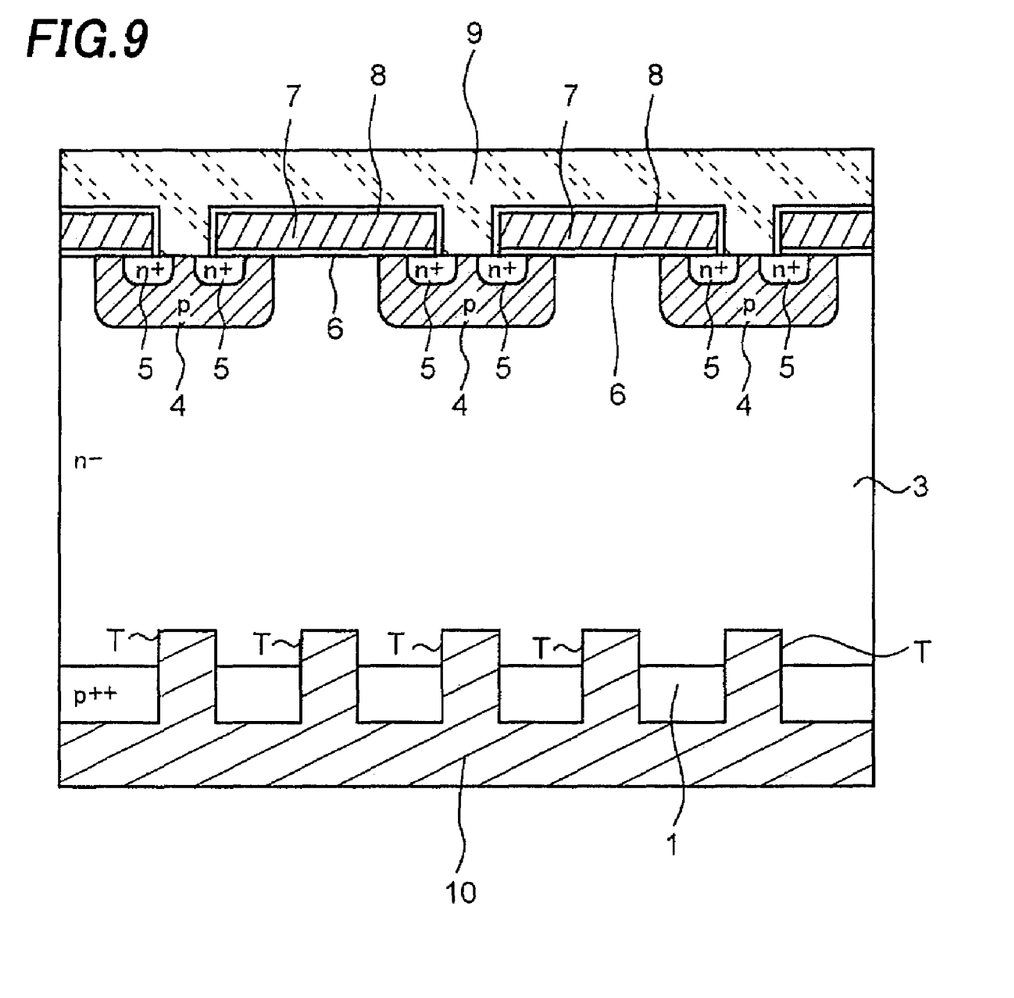

Furthermore, the above description of the semiconductor device and the method of manufacturing the semiconductor device of the embodiment is given for the IGBT formed with the buffer layer 2. However, the invention is not limited to this, and may be applied to the non-punch-through type IGBT, for example, as shown in FIG. 9. In this case, the trenches T are formed penetrating through the collector layer 1 and terminating in the drift layer 3. Furthermore, by forming the collector electrode 10 covering the collector layer 1 and the inside of the trenches T, the current path which does not pass through the collector layer 1 is formed and this path functions as the FWD in the similar manner to the embodiment described above.

In the above description of the semiconductor device and the method of manufacturing the semiconductor device of the embodiment, the trenches T are formed by an anisotropic etching. However, the invention is not limited to this. For example, when the collector layer 1 is thin, an isotropic etching may be used for forming openings reaching the buffer layer 2.

Furthermore, in the above description of the semiconductor device and the method of manufacturing the semiconductor device of the embodiment, the collector electrode 10 fills the trenches T. However, the invention is not limited to this, and the collector electrode 10 may be formed thin along the collector layer 1 and the trenches T.

In the semiconductor device of the embodiment, the collector electrode is formed in the collector layer from its back surface to reach the buffer layer. This provides both a portion formed with the collector layer between the buffer layer and the collector electrode and a portion not formed with the collector layer therebetween. This realizes the integration of the FWD in the IGBT, independent of the thickness of the collector layer, and thus the number of processes and components is reduced in an inverter such as a motor driver.

In the method of manufacturing the semiconductor device of the embodiment, the formation of the trenches in the collector layer provides a shortcut between the collector electrode and the buffer layer. Therefore, the above structure is formed according to the etching condition of the trenches, impendent of the thickness of the collector layer. Since the punch-through type IGBT particularly has a thick collector layer, the embodiment is applied thereto excellently.

Figure 12:
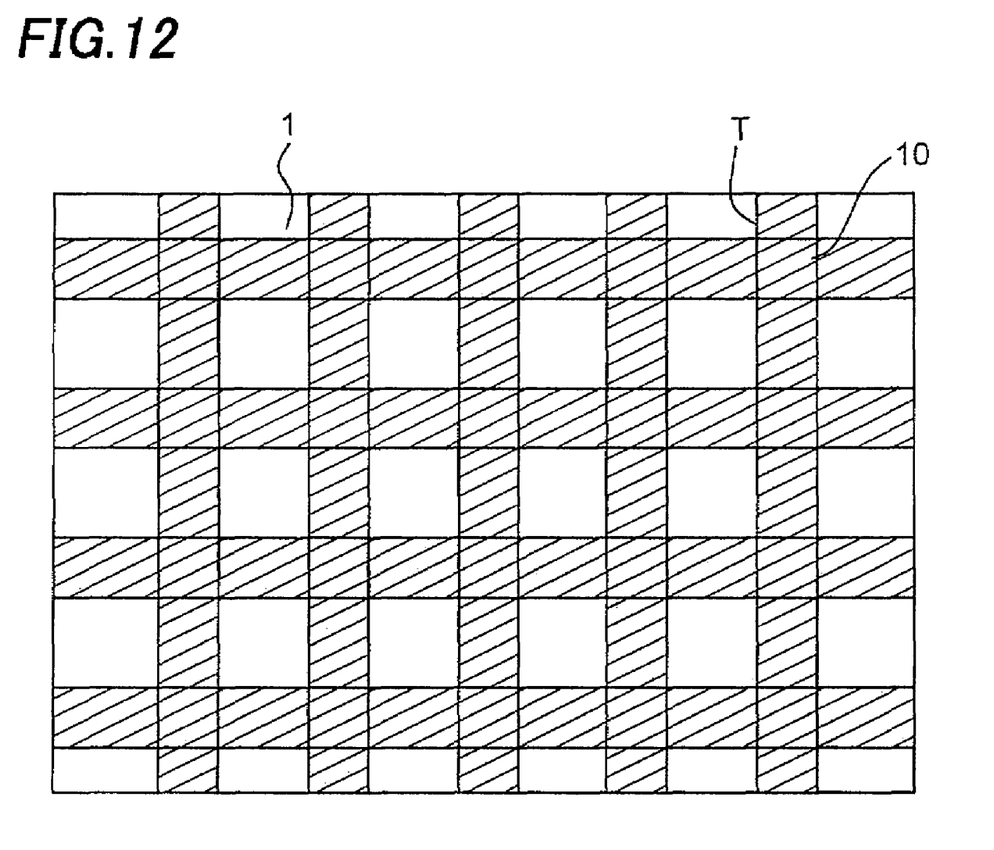
FIG. 12 shows a plane view of a semiconductor device of another embodiment of the invention.

Furthermore, in the embodiment, each of the trenches T has a circle shape and is distributed uniformly in the collector layer 1 as shown in FIG. 1B. However, the shape of the trenches T is not limited to the circle as long as they are distributed relatively uniformly in the collector layer 1. For example, the trenches T may have lattice shape as shown in FIG. 12.

What is claimed is:

1. A semiconductor device comprising:
   a collector layer of a first general conductivity type;
   a drift layer of a second general conductivity type disposed on a front surface of the collector layer;
   a base layer of the first general conductivity type disposed on the drift layer;
   a first trench penetrating through the base layer so as to reach the drift layer
   a second trench penetrating through the base layer so as to reach the drift layer;
   a gate insulation film disposed on an inner wall of each of the first and second trenches;
   a gate electrode disposed in each of the first and second trenches so as to cover the gate insulation film;
   an emitter region of the second general conductivity type formed, for each of the first and second trenches, in the base layer and adjacent a corresponding trench;
   an emitter electrode connected to the emitter regions; and
   a collector electrode disposed on a back surface of the collector layer and comprising branching portions penetrating through the collector layer,
   wherein one of the branching portions is disposed under the base layer between the first trench and the second trench, and
   none of the branching portions is disposed under the first trench or the second trench.

2. The semiconductor device of claim 1, further comprising a buffer layer of the second general conductivity type disposed between the collector layer and the drift layer and having a higher impurity concentration than the drift layer.

3. The semiconductor device of claim 2, wherein the branching portions terminate in the buffer layer.

4. The semiconductor device of claim 1, wherein the branching portions are formed as trenches.

5. The semiconductor device of claim 4, wherein the collector electrode fills the trenches.

6. The semiconductor device of claim 1, wherein the branching portions comprise tapered sidewalls.

7. The semiconductor device of claim 1, wherein the collector electrode comprises copper.

8. The semiconductor device of claim 1, wherein the collector electrode comprises polysilicon.

9. A method of manufacturing a semiconductor device, comprising:
   providing a collector layer of a first general conductivity type;
   forming a drift layer of a second general conductivity type on a front surface of the collector layer;
   forming a base layer of the first general conductivity type on the drift layer;
   forming trenches penetrating through the base layer so as to reach the drift layer;
   forming a gate insulation film on an inner wall of each of the trenches;
   forming a gate electrode in each of the trenches so as to cover a corresponding gate insulation film;
   forming emitter regions of the second general conductivity type in the base layer and adjacent the trenches;
   forming an emitter electrode connected to the emitter regions;
   forming openings from a back surface of the collector layer so that the openings penetrate through the collector layer; and
   forming a collector electrode on the back surface of the collector layer so as to fill the openings at least partially,
   wherein the openings are formed under base layer between the trenches, and
   no openings are formed under the trenches.

* * * * *